United States Patent [19]

Miller

[11] Patent Number: 4,839,535

[45] Date of Patent: Jun. 13, 1989

[54] MOS BANDGAP VOLTAGE REFERENCE CIRCUIT

[75] Inventor: Ira Miller, Tempe, Ariz.

[73] Assignee: Motorola, Inc., Schaumburg, Ill.

[21] Appl. No.: 158,423

[22] Filed: Feb. 22, 1988

[51] Int. Cl.[4] .......................... H03K 3/26; H03K 3/01

[52] U.S. Cl. .................................. 307/296.7; 307/491

[58] Field of Search .................. 307/310, 296.2, 296.6, 307/296.7, 296.8, 491, 497, 495; 323/311-316

[56] References Cited

U.S. PATENT DOCUMENTS 4,287,439 9/1981 Leuschner .......................... 307/297

4,380,706 4/1983 Wrathall ............................ 307/297

*Primary Examiner*—Stanley D. Miller

*Assistant Examiner*—Richard Roseen

*Attorney, Agent, or Firm*—Michael D. Bingham

[57] ABSTRACT

A bandgap voltage reference circuit manufactured with a MOS process is provided which is stable over temperature variations as well as variations in threshold voltage that does not require an operational amplifier. The reference is generated by a MOS current source two sourcing current to substrate bipolar transistors operating at different current densities and operated as emitter followers having a pair MOS current mirrors sinking current therefrom. A start-up circuit initializes the circuit upon application of supply voltages. An output stage multiplies the bandgap reference voltage to the desired output voltage level. A feedback stage improves the accuracy of the output voltage by adjusting the current in the reference circuit.

21 Claims, 1 Drawing Sheet

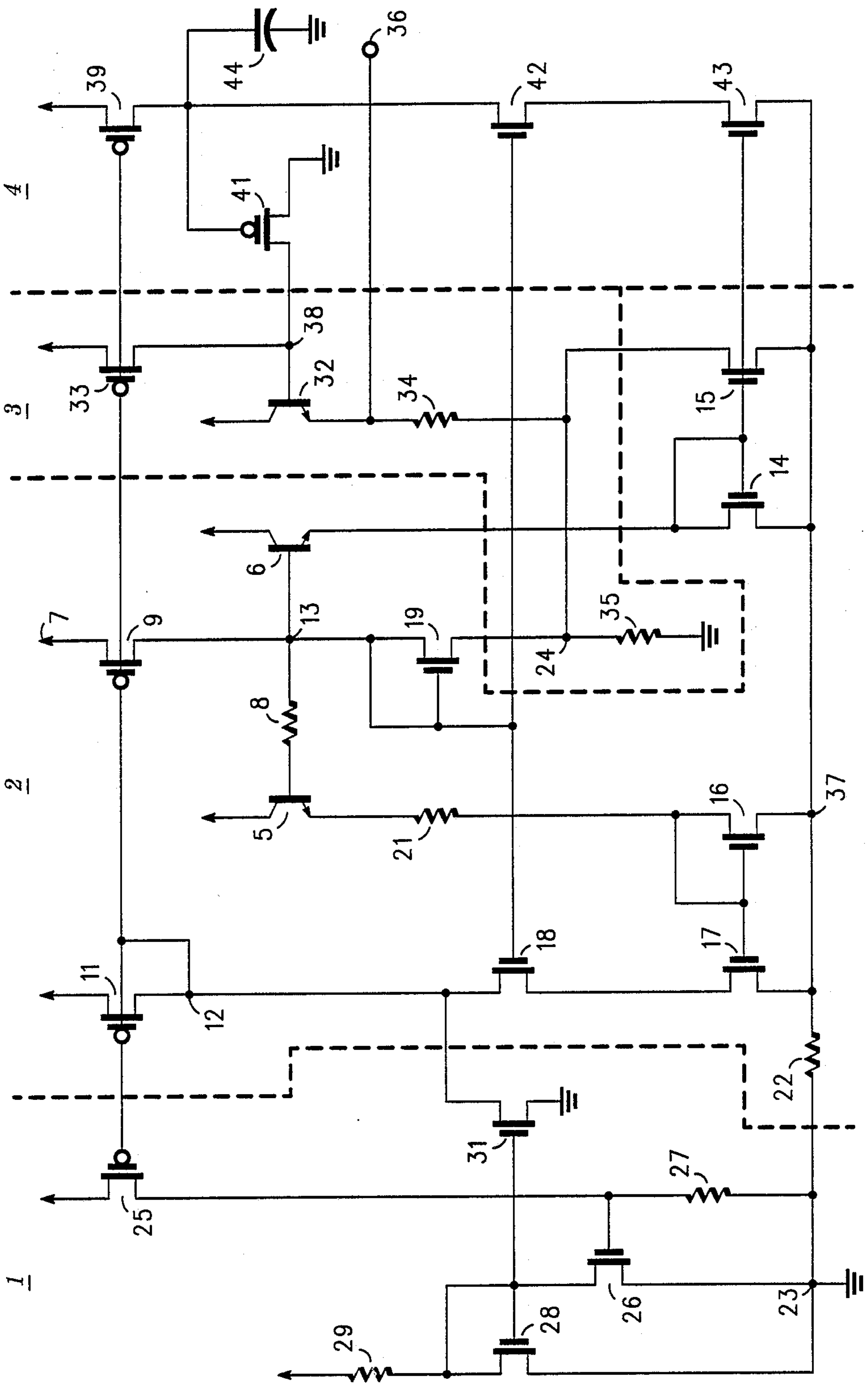
1
2
3
4
5
6
7
8
9
11
12
13
14
15
16
17
18
19
21
22
23
24
25
26
27
28
29
31
32
33
34
35
36
37
38
39
41
42
43
44

MOS BANDGAP VOLTAGE REFERENCE CIRCUIT

FIELD OF THE INVENTION

This invention relates in general to voltage reference circuits and, more particularly, to a metal oxide semiconductor (MOS) bandgap voltage reference circuit which provides a reference voltage stable over temperature and process variations.

BACKGROUND OF THE INVENTION

In the past, many different methods of supplying a regulated voltage have been used. One well known method is to use the zener breakdown voltage of a PN junction as the reference; however, this method is limited in accuracy to its positive temperature coefficient. A second method depends upon the MOSFET threshold voltage, $V_t$, which is limited in accuracy to both the current flowing in the device as well as the variation of a number of process parameters.

A more accurate reference voltage may be achieved by using bandgap voltage reference circuits which are capable of providing output voltage levels below $V_{DD}$ that are stable over temperature and process variations. In the past, this has been accomplished using both bipolar and MOS circuits. U.S. Pat. No. 3,887,863 by Brokaw discloses a circuit of the former type using two bipolar transistors to generate the bandgap voltage and an operational amplifier which provides feedback and a resulting nearly zero temperature coefficient.

It is common in MOS bandgap voltage reference circuits to build substrate bipolar transistors which are used as emitter followers wherein the emitter of one transistor is much larger than the emitter of the second transistor. The same bias voltage is applied to the bases of both transistors causing different current densities to flow through the emitters which in turn generates a difference between the base-emitter voltages of the transistors (delta $V_{be}$). The temperature stable reference is derived from the sum of $V_{be}$ (from the transistor having the larger emitter) and delta $V_{be}$ which are chosen to equal the bandgap voltage of 1.205 volts. This reference voltage is coupled to inputs of an operational amplifier whose output provides both feedback to the bases of the transistors as well as the reference voltage.

It is well known that the accuracy of MOS operational amplifiers depend on the offset voltage, typically 20 millivolts, which in turn reduces the accuracy of the output reference voltage below that which is achievable in the bipolar implementation. The output reference voltage is thus prone to variations in the MOS threshold voltages. Furthermore, a significant amount of area on chip must be used for the inclusion of the operational amplifier.

Thus, what is needed is a MOS bandgap voltage reference circuit that provides a reference voltage stable over temperature and process variations.

SUMMARY OF THE INVENTION

Accordingly, it is an object of the present invention to provide an improved bandgap voltage reference.

Another object of the present invention is to provide an improved bandgap voltage reference having parasitic substrate bipolar transistors and MOS transistors.

A further object of the present invention is to provide a MOS voltage reference that is equal to or greater than the bandgap voltage and is based on the bandgap voltage which is temperature stable and is independent of threshold variations.

Yet another object of the present invention is to provide a reference voltage using a standard MOS process which provides increased accuracy, and does not require the use of an operational amplifier.

In carrying out the above and other objects of the invention in one form, there is provided a MOS bandgap voltage reference having a current source for making available a current to source the bases of first and second parasitic substrate bipolar transistors, wherein the emitter of the first transistor is larger than the emitter of the second transistor. The same bias voltage is applied to the bases of both transistors causing a larger current density to flow through the second transistor due to its smaller emitter area. This current flow differential generates a delta $V_{be}$ between the transistors which may be scaled up and is summed with the $V_{be}$ of the first transistor to achieve the desired bandgap voltage. A first MOS current mirror is coupled to the emitter of the first bipolar transistor for providing a current substantially equal to the collector current of the first bipolar transistor and thus acts as a second collector or pseudo collector which is then coupled to the current source. A second MOS current mirror is coupled to the emitter of the second bipolar transistor for providing a current substantially equal to the collector current of the second bipolar transistor and thus acts as a second collector or pseudo collector for the second bipolar transistor. The second MOS current mirror is also coupled to a bandgap reference node for sinking a current from the bandgap reference node. A MOS transistor has its gate and drain coupled to the bases of the first and second bipolar transistors and its source coupled to the bandgap reference node for cancelling an equivalent voltage drop that occurs across MOS devices in the current mirrors.

The above and other objects, features, and advantages of the present invention will be better understood from the following detailed description taken in conjunction with the accompanying drawing.

BRIEF DESCRIPTION OF THE DRAWING

The single figure is a schematic diagram of the preferred embodiment

DETAILED DESCRIPTION OF THE INVENTION

The single figure illustrates a bandgap voltage reference circuit that may be fabricated using a standard MOS process and comprises a start-up stage 1, a bandgap reference stage 2, an output stage 3, and a feedback stage 4. In standard MOS processes it is common to build substrate bipolar transistors whose collectors are limited to and formed by the substrate. The bandgap reference stage 2 comprises two such parasitic substrate bipolar transistors 5 and 6 with transistor 5 having a much larger emitter area than transistor 6. The collectors of transistors 5 and 6 are connected to a supply voltage terminal 7 and the bases are coupled together by resistor 8. When the same amount of current flows through transistors 5 and 6, the current density in transistor 6 will be inversely proportional to the current density in transistor 5 based on the emitter areas. It follows then, since transistor 5 has a much larger emitter area, transistor 6 will have a much larger current density.

Transistors 9 and 11 form a current source for the bandgap reference stage 2. Transistors 9 and 11 have their sources connected to the supply voltage terminal 7 and their gates connected to the drain of transistor 11 which forms a voltage output terminal 12. Transistor 11 is connected to function as a diode and sets the voltage at the gate of transistor 9 such that transistors 9 and 11 form a current mirror. Transistor 9 has a drain connected to the base of transistor 6 forming a current output terminal 13. Transistor 9 supplies base current to bipolar transistors 5 and 6.

Transistors 14 and 15 have their gates connected to both the drain of transistor 14 and the emitter of transistor 6, and their sources are connected to node 37 which is coupled to a supply voltage terminal 23 by resistor 22. Likewise, transistors 16 and 17 have their gates connected to the drain of transistor 16 and further coupled to the emitter of transistor 5 by resistor 21 and their sources connected to node 37. Transistor pair 16 and 17 form a MOS current mirror for the emitter of transistor 5, and transistor pair 14 and 15 form another MOS current mirror for the emitter of transistor 6 and for sinking a current from the base of transistor 6. The transistor pairs used in each current mirror can be closely matched assuring that current flowing through each mirror can be made equal. Furthermore, the transistors within each current mirror can also be closely matched. As a result, the current available at the drain of transistor 17 is substantially equal to the collector current of transistor 5, and the current available at the drain of transistor 15 is substantially equal to the collector current of transistor 6. Thus the drain of transistor 15 acts as a pseudo collector for transistor 6 and the drain of transistor 17 acts as a pseudo collector for transistor 5. This provides a unique solution of essentially making available a collector for each bipolar transistor 5 and 6 that is not limited to the substrate as has been the case in previous implementations.

Transistor 18 has a source connected to the drain of transistor 17, a drain connected to the voltage output terminal 12 and a gate connected to the current output terminal 13. Transistor 18 acts as a cascode transistor to the current mirror comprising transistors 16 and 17 which raises its output impedance. The source of transistor 19 and the drain of transistor 15 are connected to a bandgap reference node 24. The gate and drain of transistor 19 are connected to the current output terminal 13. A voltage equal to the voltage from the gate to source ($V_{gs}$) will be dropped across transistor 19 and equals the voltage developed across transistor 14 or 16 ($V_{gs14}=V_{gs16}$) in the current mirrors. Due to the voltage developed across transistors 14 and 16 ($V_{gs14}$, $V_{gs16}$) the voltage at the base of transistor 6 equals the sum of the bandgap voltage and $V_{gs14}$ (or $V_{gs16}$). Since transistor 19 is coupled between the base of transistor 6 and the bandgap reference node 24, the voltage at the bandgap reference node 24 equals the bandgap voltage.

The start-up stage 1 comprises a transistor 25 having a source connected to the supply voltage terminal 7, a gate connected to the voltage output terminal 12, and a drain connected to the gate of transistor 26 and to the supply voltage terminal 23 by resistor 27. Transistors 26 and 28 have their drains connected to the gates of transistors 28 and 31 and further coupled to the supply voltage terminal 7 by resistor 29, and their sources connected to the supply voltage terminal 23. Transistor 31 has a source connected to the supply voltage terminal 23 and a drain connected to the voltage output terminal 12.

Because the bandgap reference stage 2 has only two stable operating points (0 volts and the bandgap voltage), the start-up stage 1 is necessary to ensure the bandgap reference stage 2 operates at its stable bandgap voltage operating point upon application of power to supply voltage terminals 7 and 23. Upon application of power, an initial current will flow through transistor 28 with its magnitude determined by the size of transistor 28 and the value of resistor 29. This in turn will supply a voltage at the gate of transistor 31 which will cause transistor 31 to sink a current from the voltage output terminal 12 until the bandgap reference stage reaches its stable bandgap voltage operating point. By this time the current flowing through transistor 25 and resistor 27 is large enough to cause the voltage at the gate of transistor 26 to cause transistor 26 to conduct enough current to effectively pull down the voltage at the gate of transistor 31. This in turn causes transistor 31 to shut off and therein discontinue sinking current from the voltage output terminal 12.

In output stage 3, transistor 32 has its collector connected to the supply voltage terminal 7 and its emitter connected to an output terminal 36. The output terminal 36 is further coupled to the bandgap reference node 24 by resistor 34, and bandgap reference node 24 is further coupled to the supply voltage terminal 23 by resistor 35. Transistor 33 has its source connected to the supply voltage terminal 7, its gate connected to the voltage output terminal 12, and its drain connected to the base of transistor 32 forming a feedback terminal 38. The values chosen for resistors 34 and 35 determine the voltage at the output terminal 36 by multiplying the bandgap voltage at the bandgap reference node 24. By way of example, if resistor 35 ($R_{35}$) is chosen to equal 10,000 ohms, a bandgap voltage of 1.23 volts at bandgap reference node 24 will force a current, $I_1$. Where $I_1$ is given by:

$$I_1 = V_{bandgap}/R_{35}$$

$$I_1 = 1.23 \text{ volts}/10{,}000 \text{ ohms} = 0.123 \text{ milliamps.}$$

This will also cause 0.123 milliamps to flow through resistor 34. If an output of 3.75 volts is desired at the output terminal 36, then the value of the resistor 34 ($R_{34}$) should be chosen such that the following equation is satisfied:

$$3.75 \text{ volts} = 1.23 \text{ volts} + I_1(R_{34}).$$

Solving for the equation provides the resistor 34 with a value of 20,500 ohms. Transistor 32 has the necessary gain to provide the current flow, $I_1$.

The feedback stage 4 comprises a transistor 39 having a source connected to the supply voltage terminal 7, a gate connected to the voltage output terminal 12, and a drain connected to the gate of transistor 41 and coupled to the supply voltage terminal 23 by a capacitor 44. Transistor 41 has a source connected to the supply voltage terminal 23 and a drain connected to feedback terminal 38. Transistor 42 has its drain connected to the drain of transistor 39, its gate connected to the current output terminal 13, and its source connected to the drain of transistor 43. The source of transistor 43 is connected to node 37 and its gate is connected to the emitter of transistor 6. The feedback stage 4 provides additional stability to the operation of the bandgap reference stage 2. If the current flowing through transistor 6 were to deviate from its optimum value, a corresponding change in voltage would appear at the gate of transistor 43 through the action of the current mirror comprising transistors 14 and 15. This in turn would cause a change in voltage in the opposite direction at the gate of transistor 41. The voltage at feedback terminal 38 will change the bias on the base of transistor 32 such that the current in the current mirror comprising transistors 14 and 15 will be brought back to its original value. This restores the voltage at the bandgap reference node 24 to its original value since it depends upon the current flowing in the current mirror comprising transistors 14 and 15. Because the base of transistor 6 is coupled to the bandgap reference node 24 by transistor 19, its original voltage will also be restored.

The bandgap reference voltage output at the bandgap reference node 24 is developed by forcing different current densities through transistors 5 and 6. As noted earlier, this is accomplished by forcing equal currents through transistors 5 and 6 and designing transistor 5 to have a much larger emitter area than transistor 6. The transistors in the first current mirror are matched to the transistors in the second current mirror which ensures the current flowing in transistor 5 is equal to the current flowing in transistor 6. An alternative method of forcing different current densities through transistors 5 and 6 could be to use equal emitter areas and unmatched current mirrors or some combination of the two. The voltage developed across resistor 21, delta $V_{be}$, plus the base-emitter voltage across transistor 5, $V_{be5}$, will equal the base-emitter voltage across transistor 6, $V_{be6}$, since the bases of transistors 5 and 6 are coupled together. This is possible since it has been shown that for two different current densities flowing through two transistors, the delta in base-emitter voltage is given by:

$$\text{delta } V_{be}=(KT/q)\ln n$$

where K is Boltzman's constant, T is absolute temperature, q is the charge of an electron, and n is the ratio of the transistor emitter areas. In this circuit, delta $V_{be}$ is designed so that the following relationship is satisfied:

$$V_{bandgap}=1.205 \text{ volts}=(V_{be5}+\text{delta } V_{be})R_{22}/R_{21}.$$

As has been previously shown by Widlar in U.S. Pat. No. 4,249,122, if the sum of a forward diode drop ($V_{be5}$) plus a diode drop differential (delta $V_{be}$) equals the energy gap of silicon (1.205 volts), this sum value is almost temperature stable.

Furthermore, the gate to source voltage across transistor 16, $V_{gs16}$, is matched by the gate to source voltage across transistor 14, $V_{gs14}$. The effects of the additional voltage drops by transistors 14 and 16 are cancelled by an equivalent gate to source voltage drop across transistor 19. The bandgap reference voltage is also stable over variations in threshold voltage since the voltages across transistors 14, 15, and 19 track each other. Not only do the current mirrors offer better tracking accuracy than resistors which have been used previously, but they also require much less area.

By now it should be appreciated that there has been provided a MOS bandgap voltage reference circuit which provides a reference voltage based on the bandgap voltage and is stable over temperature and process variations. This bandgap reference circuit provides excellent accuracy without the need for an operational amplifier.

I claim:

1. A circuit comprising:
- a first supply voltage terminal;
- a second supply voltage terminal;
- current source means having a voltage output terminal and a current output terminal for mirroring a first current sourced from said voltage output terminal to said current output terminal;
- a first bipolar transistor having a collector coupled to said first supply voltage terminal, a base coupled to said current output terminal, and having an emitter;
- a second bipolar transistor having a collector coupled to said first supply voltage terminal, a base coupled to said current output terminal, and having an emitter;
- first MOS current mirror means coupled between the emitter of said first bipolar transistor and said second supply voltage terminal, and coupled to said voltage output terminal for sinking a second current from the emitter of said first bipolar transistor;
- second MOS current mirror means coupled between the emitter of said second bipolar transistor and said second supply voltage terminal, and coupled to a bandgap reference node for sinking a third current from the emitter of said second bipolar transistor and sinking a fourth current from the bandgap reference node; and
- first means coupled between the base of said second bipolar transistor and the bandgap reference node for providing an output voltage at the bandgap reference node.

2. A circuit according to claim 1 wherein said current source means comprises:
- a first field effect transistor having a source coupled to said first supply voltage terminal, and a gate and a drain coupled to said voltage output terminal; and
- a second field effect transistor having a source coupled to said first supply voltage terminal, a gate coupled to said voltage output terminal, and a drain coupled to said current output terminal.

3. A circuit according to claim 1 wherein said first means comprises a first field effect transistor having a gate and a drain coupled to the base of said second bipolar transistor, and a source coupled to the bandgap reference node.

4. A circuit according to claim 1 further comprising a resistor coupled between the base of said first bipolar transistor and said current output terminal.

5. A circuit according to claim 1 wherein said first MOS current mirror means comprises:
- a first field effect transistor having a source coupled to said second supply voltage terminal, and a gate and a drain coupled to the emitter of said first bipolar transistor; and
- a second field effect transistor having a source coupled to said second supply voltage terminal, a gate coupled to the gate of said first field effect transistor, and a drain coupled to said voltage output terminal.

6. A circuit according to claim 5 wherein said second MOS current mirror means comprises:
- a third field effect transistor having a source coupled to said second supply voltage terminal, and a gate and a drain coupled to the emitter of said second bipolar transistor; and a fourth field effect transistor having a source coupled to said second supply voltage terminal, a gate coupled to the gate of said third field effect transistor, and a drain coupled to the bandgap reference node.

7. A circuit according to claim 6 further comprising a fifth field effect transistor having a source coupled to said voltage output terminal, a drain coupled to the drain of said second field effect transistor, and a gate coupled to the base of said second bipolar transistor.

8. A circuit according to claim 6 further comprising:

a first resistor coupled between the sources of said first, second, third and fourth field effect transistors and said second supply voltage terminal; and a second resistor coupled between the drain of said first field effect transistor and the emitter of said first bipolar transistor.

9. A circuit according to claim 1 further comprising a start-up means coupled between said first and second supply voltage terminals, and coupled to said voltage output terminal for sinking a start-up current from said voltage output terminal when power is initially applied to said first and second supply voltage terminals.

10. A circuit according to claim 9 wherein said start-up means comprises:

a first resistor;

a second resistor;

a first field effect transistor having a source coupled to said second supply voltage terminal, and a gate and a drain coupled to said first supply voltage terminal by said first resistor;

a second field effect transistor having a drain coupled to the gate of said first field effect transistor, a source coupled to said second supply voltage terminal, and a gate coupled to said second supply voltage terminal by said second resistor;

a third field effect transistor having a source coupled to said first supply voltage terminal, a drain coupled to the gate of said second field effect transistor, and a gate coupled to said voltage output terminal; and a fourth field effect transistor having a source coupled to said second supply voltage terminal, a drain coupled to said voltage output terminal, and a gate coupled to the drain of said second field effect transistor.

11. A circuit according to claim 1 further comprising an output means coupled between said first and second supply voltage terminals, and coupled to the bandgap reference node, and having a feedback terminal and an output terminal for providing an output voltage at said output terminal.

12. A circuit according to claim 11 wherein said output means comprises;

a third bipolar transistor having a collector coupled to said first supply voltage terminal, an emitter coupled to said output terminal, and a base coupled to said feedback terminal;

a first field effect transistor having a source coupled to said first supply voltage terminal, a drain coupled to said feedback terminal, and a gate coupled to said voltage output terminal;

a first resistor coupled between said output terminal and the bandgap reference node; and a second resistor coupled between the bandgap reference node and said second supply voltage terminal.

13. A circuit according to claim 12 further comprising feedback means coupled between said first and second supply voltage terminals, and coupled to said current source means, and to the emitter of said second bipolar transistor for providing a feedback voltage to improve the bandgap voltage reference stability.

14. A circuit according to claim 13 wherein said feedback means comprises:

a second field effect transistor having a source coupled to said first supply voltage terminal, a gate coupled to said voltage output terminal, and having a drain;

a third field effect transistor having a gate coupled to the drain of said second field effect transistor, a source coupled to said feedback terminal, and a drain coupled to said second supply voltage terminal;

a fourth field effect transistor having a drain coupled to the drain of said second field effect transistor, a gate coupled to said current output terminal, and having a source;

a fifth field effect transistor having a drain coupled to the source of said fourth field effect transistor, a source coupled to said second supply voltage terminal, and a gate coupled to the emitter of said second bipolar transistor; and a capacitor coupled between the drain of said second field effect transistor and said second supply voltage terminal.

15. A circuit comprising:

a first supply voltage terminal;

a second supply voltage terminal;

current source means having a voltage output terminal and a current output terminal for mirroring a first current sourced from said voltage output terminal to said current output terminal;

a first bipolar transistor having a collector coupled to said first supply voltage terminal, a base coupled to said current output terminal, and having an emitter;

a second bipolar transistor having a collector coupled to said first supply voltage terminal, a base coupled to said current output terminal, and having an emitter;

first MOS current mirror means coupled between the emitter of said first bipolar transistor and said second supply voltage terminal, and coupled to said voltage output terminal for sinking a second current from the emitter of said first bipolar transistor;

second MOS current mirror means coupled between the emitter of said second bipolar transistor and said second supply voltage terminal, and coupled to a bandgap reference node for sinking a third current from the emitter of said second bipolar transistor and sinking a fourth current from the bandgap reference node;

first means coupled between the base of said second bipolar transistor and the bandgap reference node for providing an output voltage at the bandgap reference node;

start-up means coupled between said first and second supply voltage terminals, and coupled to said voltage output terminal for sinking a start-up current from said voltage output terminal when power is initially applied to said first and second supply voltage terminals;

output means coupled between said first and second supply voltage terminals, and coupled to the bandgap reference node, and having a feedback terminal and an output terminal for providing an output voltage at said output terminal; and feedback means coupled between said first and second supply voltage terminals, and coupled to said current source means, and to the emitter of said second bipolar transistor for providing a feedback voltage to improve the bandgap voltage reference stability.

16. A bandgap reference circuit fabricated in a MOS process technology comprising:

a first supply voltage terminal;

a second supply voltage terminal;

current source means having a voltage output terminal and a current output terminal for mirroring a first current sourced from said voltage output terminal to said current output terminal;

a first parasitic substrate bipolar transistor having a collector coupled to said first supply voltage terminal, a base coupled to said current output terminal, and having an emitter;

a second parasitic substrate bipolar transistor having a collector coupled to said first supply voltage terminal, a base coupled to said current output terminal, and having an emitter;

first MOS current mirror means coupled between the emitter of said first parasitic substrate bipolar transistor and said second supply voltage terminal, and coupled to said voltage output terminal for sinking a second current from the emitter of said first parasitic substrate bipolar transistor;

second MOS current mirror means coupled between the emitter of said second parasitic substrate bipolar transistor and said second supply voltage terminal, and coupled to a bandgap reference node for sinking a third current from the emitter of said second parasitic substrate bipolar transistor and sinking a fourth current from the bandgap reference node; and first means coupled between the base of said second parasitic substrate bipolar transistor and the bandgap reference node for providing an output voltage at the bandgap reference node.

17. A circuit according to claim 16 wherein said current source means comprises:

a first field effect transistor having a source coupled to said first supply voltage terminal, and a gate and a drain coupled to said voltage output terminal; and a second field effect transistor having a source coupled to said first supply voltage terminal, a gate coupled to said voltage output terminal, and a drain coupled to said current output terminal.

18. A circuit according to claim 16 wherein said first means comprises a first field effect transistor having a gate and a drain coupled to the base of said second parasitic substrate bipolar transistor, and a source coupled to the bandgap reference node.

19. A circuit according to claim 16 further comprising a resistor coupled between the base of said first parasitic substrate bipolar transistor and the said current output terminal.

20. A circuit according to claim 16 wherein said first MOS current mirror means comprises:

a first field effect transistor having a source coupled to said second supply voltage terminal, and a gate and a drain coupled to the emitter of said first parasitic substrate bipolar transistor; and a second field effect transistor having a source coupled to said second supply voltage terminal, a gate coupled to the gate of said first field effect transistor, and a drain coupled to said voltage output terminal.

21. A circuit according to claim 20 wherein said second MOS current mirror means comprises:

a third field effect transistor having a source coupled to said second supply voltage terminal, and a gate and a drain coupled to the emitter of said second parasitic substrate bipolar transistor; and a fourth field effect transistor having a source coupled to said second supply voltage terminal, a gate coupled to the gate of said third field effect transistor, and a drain coupled to the bandgap reference node.

* * * * *